United States Patent [19]

Cannon et al.

[11] Patent Number: 4,604,579

[45] Date of Patent: Aug. 5, 1986

[54] METHOD AND APPARATUS FOR ENHANCED T1 NMR MEASUREMENTS USING REPETITION INTERVALS TR RELATED TO ONE ANOTHER BY INTEGER MULTIPLES

[75] Inventors: Clifford R. Cannon, Pacifica; Douglas A. Ortendahl, Berkeley, both of Calif.

[73] Assignee: The Regents of the University of California, Berkeley, Calif.

[21] Appl. No.: 515,857

[22] Filed: Jul. 21, 1983

[51] Int. Cl.[4] .................... G01N 24/08; G01R 33/20
[52] U.S. Cl. .................................................. 324/309
[58] Field of Search ............... 324/300, 307, 309, 312

[56] References Cited

U.S. PATENT DOCUMENTS 4,297,637 10/1981 Crooks et al. ...................... 324/309
4,318,043  3/1982 Crooks et al. ...................... 324/309
4,471,305  9/1984 Crooks et al. ...................... 324/309

FOREIGN PATENT DOCUMENTS 2113399  8/1983 United Kingdom ................ 324/300

OTHER PUBLICATIONS

Crooks et al, "Nuclear Magnetic Resonance Whole-Body Imager Operating at 3.5 KGauss", Radiology, vol. 143, Apr., 1982.

Wehrli et al, "The Dependence of Nuclear Magnetic Resonance (NMR) Image Contrast on Intrinsic and Operator-Selectable Parameters", presented at the Meeting of SPIE, Medicine XII, vol. 419, Apr., 1983.

Mansfield et al., "Planar Spin Imaging by NMR", Journal of Magnetic Resonance, vol. 27, No. 1, Jul., 1977.

Primary Examiner—Reinhard J. Eisenzopf
Assistant Examiner—Kevin D. O'Shea
Attorney, Agent, or Firm—Nixon & Vanderhye

[57] ABSTRACT

An analytic closed solution for the spin-lattice relaxation time T1 is provided in terms of the repetition interval time TR and the differing NMR signal response intensities $I_1$ and $I_2$ obtained when using different repetition intervals $TR_1$ and $TR_2$ which are related to one another by integer multipliers. The result is a method and apparatus which directly and non-iteratively generate a spin-lattice relaxation time signal value T1 for each voxel within a selected region of an object under test so as to quickly, economically and accurately produce a T1 image of nutated nuclei within the region.

23 Claims, 4 Drawing Figures

METHOD AND APPARATUS FOR ENHANCED T1 NMR MEASUREMENTS USING REPETITION INTERVALS TR RELATED TO ONE ANOTHER BY INTEGER MULTIPLES

This invention relates to apparatus and method for NMR (nuclear magnetic resonance) imaging wherein data representing the internal point-by-point distribution of selected molecular structures within an object under test are obtained using nuclear magnetic resonance phenomena. More particularly, this invention relates to generation of an image of the T1 spin-lattice relaxation times for NMR nuclei within a selected volume of the object under test.

This application is related to copending commonly assigned applications Ser. No. 331,008, filed Dec. 15, 1981 (now issued as U.S. Pat. No. 4,471,305); Ser. No. 515,116 filed July 19, 1983; Ser. No. 515,117 filed July 19, 1983; Ser. No. 515,957 filed July 21, 1983 and to the commonly assigned issued U.S. Pat. Nos. 4,318,043 and 4,297,637. The entire specifications and drawings of these related copening applications and of these earlier related now issued U.S. patents are hereby expressly incorporated by reference.

NMR imaging is based on the ability to induce and monitor resonance of the magnetic moment of selected nuclei in the presence of magnetic fields. By the use of position-variant magnetic fields, it is possible to measure both the location and concentration in small volumes of resonant nuclei and, thereby, to create a visual display image that reflects this distribution in living tissue (e.g., a human body) or in other internal structures of an object under examination. Hydrogen, because it is the most sensitive of the stable nuclei to NMR phenomena and because it is also the most abundant nucleus in the human body, is ideally suited for NMR imaging. NMR imaging is a non-invasive diagnostic technique having some general similarity to computed tomography scanning (utilizing X-ray radiation) albeit is based upon an entirely different physical phenomenon.

A detailed explanation of the particular NMR spin echo phenomena is already set forth in the related earlier referenced copending applications and issued patents. Nevertheless, a brief review of some salient points is included here.

BACKGROUND

The basic NMR phenomenon is the property of all nuclei having an odd number of protons and/or neutrons to act as small magnets. In the absence of an applied magnetic field, the magnetic axes of these nuclei point in random directions; however, when placed in a strong applied static magnetic field, these axes tend to align with the field. If radio frequency energy of the proper resonant frequency and having its r.f. magnetic field component perpendicular to the static magnetic field is then transmitted throughout the object under test, the resonant nuclei will nutate (e.g. turn) their magnetic axes (e.g., "flip") against the applied static magnetic field. If such radio waves are then terminated (e.g., such as by termination of an appropriate RF pulse), the magnetic axes of the earlier "flipped" nuclei tend to relax back toward their original alignment with the applied static magnetic field. In doing so, radio frequency waves (of the same frequency as that applied in the earlier flipping r.f. pulse if the magnetic field at the nuclei location is unchanged) are emitted and may be detected by an appropriate radio frequency receiver arrangement.

The first and longest NMR r.f. response to appear is the FID (free induction decay). However due to relative dephasing phenomena of the spinning nuclei during the FID it decays and if the dephasing is reversed a so-called spin echo signal can be generated. For example, if a 90° nutation r.f. pulse is first applied, the flipped nuclei will begin to "dephase" in their relative rotational speeds. If after t seconds a 180° nutation r.f. pulse is applied, the dephasing sense of each flipped nuclei is reversed resulting in an "in phase" condition after another t seconds. This "in phase" condition results in a detectable pulse of r.f. energy known as a spin-echo.

Because there are known relationships between the strength of applied magnetic fields and the frequencies of resultant NMR responses, this NMR excitation/detection sequence can be utilized to obtain basic information concerning the location and distribution of specific nuclei within an object under test.

For example, in any given magnetic field, the frequency of transmitted RF energy required to product NMR is specific (hydrogen in a magnetic field of about 3.5 KG will resonate at about 15 MHz). For all types of nuclei, the so-called Larmor resonant frequency changes in direct ratio to changes in the strength of the surrounding field at the nucleus site. For instance, hydrogen in a magnetic field of about 7 KG exhibits NMR at about 30 MHz. The constant of proportionality between NMR frequency and the instantaneous magnetic field strength at the location of the nucleus is called the magnetogyric ratio and each specific nucleus having an odd number of protons and/or neutrons has its own respectively corresponding magnetogyric ratio constant.

Actually, it is believed that only a very small fraction (e.g., two or three parts per million) of the relevant nuclei within a given measurement volume actually generate the observed NMR phenomenon at any given instant of time. This is apparently a statistical process and the actual nuclei being observed will change over time but sufficient numbers of nuclei are observed at any given instant of time so as to permit significant NMR measurements.

The elapsed time required to obtain maximum alignment of the nuclei magnetic axes with an imposed static magnetic field is typically on the order of one second for hydrogen in tissue. This exponential NMR alignment time is normally denoted by its exponential time constant "T1" (i.e. the time required to obtain $1-1/e$ of the asymtote or final expected value) and is sometimes known as the longitudinal magnetic relaxation time or as the spin-lattice magnetic relaxation time. It is a function of many local physical and chemical factors including molecular structure, elemental composition, temperature and viscosity. In general, even if only hydrogen nuclei are observed in an NMR imaging scanner, and even if it is assumed that all tissues have equal hydrogen densities, the measured T1 NMR parameter may be expected to differ significantly between different body tissues.

The rate at which NMR signal emission decays is another characteristic exponential time factor and is usually less than the T1 value. This second NMR time factor is commonly referred to by its exponential time constant "T2" and is sometimes known as the transverse magnetic relaxation time or spin-spin magnetic relaxation time. It constitutes another NMR time parameter that is dependent not only upon local physical and chemical factors including molecular structure, elemental composition, temperature and viscosity (not necessarily in exactly the same way as is the T1 parameter however). Accordingly, the T2 parameters are in general also different for different body tissues. For example, the nuclei of very pure liquids, in general, align with an applied static magnetic field less quickly and emit NMR signals for a longer time than do nuclei of liquids loaded with proteins.

Since the time constants associated with NMR phenomena are quite long compared to readily achievable response times of electronic circuits (i.e., radio frequency and magnetic gradient coils), it is possible to use a succession of different magnetic gradients and RF pulses to selectively produce NMR signal responses that can be detected and associated with specific elemental internal volumes of an object under test.

In general, since the frequency of the RF energy required to excite NMR and/or of resultant NMR signals is proportional to the instantaneous magnetic field strength at the measured volume, if the magnetic field strength has a spatial distribution that is known, then the frequency spectrum of NMR exciation/detected signals also encodes the spatial distribution of the NMR nuclei.

Varying the elapsed time interval between successive excitations of a measured volume will produce different amplitudes of NMR response signals in accordance with the T1 parameters associated with the nuclei of the measured volume. That is, if the interval between successive NMR excitations is relatively short, tissues with longer T1 parameter values will yield relatively less NMR response signal than those with shorter T1 parameter values since the former have less chance to become fully re-aligned with the static magnetic field before a new measurement cycle is initiated. In addition, varying the elapsed time interval between the initiation of a measurement cycle (i.e., the first NMR excitation RF pulse required to eventually result in a desired NMR response signal) and the subsequent occurrence of the desired NMR spin echo response signal will produce different corresponding amplitudes of NMR spin echo response in accordance with the $T_2$ parameters of the tissues in the measured volume. That is, tissues in the measured volume having longer T2 parameter values will provide relatively larger NMR response signals than those having shorter T2 parameter values.

Motion factors can also change the resultant NMR signal intensity in a live object. For example, if hydrogen nuclei move through the measurement volume during one measurement cycle (e.g., approximately 35 milliseconds), the potential NMR response signal from these nuclei will be completely lost. On the other hand, if only a fraction of such nuclei remain within the measurement volume during the measurement cycle time, the intensity of the NMR response signal will be correspondingly reduced. As should be apparent, the actual reduction in intensity of NMR response signals due to motion factors depends upon the fraction of effected nuclei that are in motion and upon their velocity.

Accordingly, images of an object cross-section constructed from measured intensity of NMR responses represent a complex function of physical characteristics of the tissue and of selectable instrument parameters which can be selectively manipulated.

The instrumentation for NMR imaging systems reflects the sequence by which nuclear magnetic resonance is achieved. A typical system will include a large magnet to create the surrounding magnetic field, magnetic field gradient producing coils to create position dependent magnetic fields, an RF coil to apply and receive the resonant frequency r.f. signals, electronic circuitry to generate, transmit and record the electromagnetic radiations, and a digital data acquisition, processing, and display system.

A variety of different NMR methods to define a measured volume have been developed. All techniques, however, are based on the relationship between RF frequency and magnetic field. Because it is impossible to create a magnetic field with a different strength at every point in space at the same time, all techniques use changing magnetic fields to define volumes. Magnetic field gradients can be used during transmission or reception or both.

The exemplary NMR imager described in the earlier-referenced applications and patents illustrates electronic selection of desired sub-volumes in the object. A slice in the sample can be exited by exposing the sample to a magnetic field variation and a r.f. magnetic field such that only the desired plane corresponds to the frequencies of the r.f. magnetic field. Two intersecting such planes (actually planar volumes) can be excited and the two r.f. fields which separately excite the planes can be chosen so that a signal known as a spin echo will be emitted (at a later time) only by nuclei located at the intersection of the two earlier excited planes (which intersection can itself be a planar volume where the two selected planar volumes are coplanar). The spin echo under these circumstances contains information about only the nuclei located within this common intersecting volume. By applying a field variation within such an intersecting volume, for example, during read out, a spatially-encoded frequency spectrum of the emitted r.f. signal is produced. The intensity I of each frequency component of the spin echo will be a function of the hydrogen density H, the T1, and the T2 parameters of the selected volume element. A map of the hydrogen density modified by T1 and T2 can thus be obtained from the frequency spectra of the spin echo signals. The relaxation times cna be measured by observing signal strength when the relevant T1 and T2 instrument parameters are varied.

In NMR, as already explained, each tissue is characterized by three parameters: Hydrogen density (H), and the rate at which the polarization of the hydrogen nuclei changes, given by the two times, T1 and T2. The imaging procedures used result in data that is dependent in a complex manner on all three parameters.

The relationship of observed NMR intensity (I) to the four physical parameters (H, T1, T2, and motion), is approximately given by:

$$I = Hf(v) \exp(-TE/T2)[1-\exp(-TR/T1)] \qquad \text{Eq. 1}$$

(Note: Actually, Equation 1 includes a denominator of $1 + \exp(-TR/T2)\exp(-TR/T1)$ which can be assumed as substantially equal to unity for TR greater than about 3T2) where I is the NMR intensity in a particular region of the image; H is the local hydrogen density; TE is the T2 parameter of the instrument (e.g. the time delay of a detected spin echo after a 90° flip pulse and affects T2 contrast), measured, for example, in milliseconds and varied within a broad range (typically 20–60 ms) under computer control; TR is the T1 parameter of the instrument (e.g. the repetition time of a complete measurement sequence and affects T1 contrast), measured, for example, in seconds and also computer controlled (typically 0.25–2.0 seconds); f(v) is a function of both the speed with which hydrogen nuclei move through the region being imaged and of the fraction of the total number of nuclei that are moving.

It is clear that if I could be measured for TR=infinity and TE=0, the result would be Hf(v). In fact, neither of these values can be reached directly. Thus, the only image that can be directly observed is a distribution of I in space. However, obtaining three images (two with different values of the T1 instrument parameter and the T2 instrument parameter held constant, and a third one where, for one value of the T1 instrument parameter, the T2 instrument parameter is changed), arithmetic manipulation can yield images of Hf(v), T1, and T2. However this has in the past required iterative curve fitting techniques.

Keeping the four parameters of the tissue in mind (H, T1, T2, and motion), resulting NMR intensities from different tissues can be understood. Hydrogen density and movement strongly affect the intensity of signal emitted from:

(a) air, becuase it has essentially no hydrogen and bone because what hydrogen it has is in a solid matrix, will show no signal at all (except where partial volume effects come into play);

(b) vessels through which blood flows will yield a low density signal, and organs with high blood flow will show a lower and "blochier" NMR intensity in a live animal when compared to signals that would obtain in the dead animal; and (c) the lung, because of its air content of approximately 70% and high blood flow, will also be of lower intensity than other soft tissues.

T1 and T2 NMR parameters play an important role in distinguishing between soft tissues. The hydrogen content of most soft tissues varies over a range of approximately 20%. Contrasting with this, T1 and T2 vary by factors of up to 500%. Tissues with short T1 and T2 values will tend to yield the largest NMR intensities, and because of the exponential nature of the modulation of H, the relatively smaller variations of this latter parameter may be overshadowed by T1 and T2 variations.

BRIEF SUMMARY OF THE INVENTION

Although T1 images have been generated in the past as noted above, such prior derivation of the T1 time has generally been achieved only by a rather complex and time consuming iterative curve-fitting technique. That is, two or more points are measured at different locations on a curve of known shape and that shape curve is then fitted (in various known ways) to the two or more empirically derived points on that curve. This rather cumbersome approach was dictated in the past because there was no known analytic or closed solution for the desired T1 time in terms of other known or measured signal or time values.

However, we have now discovered that by carefully controlling the repetition interval times $TR_1$ and $TR_2$ during two different measurement cycles to be related to one another by integer multipliers, it is possible to derive an analytic or closed solution for the desired T1 time in terms of measured or known signal intensity values or times.

The use of such a closed or analytic solution for the T1 time value permits a much more rapid and accurate determination of this value and thus greatly facilitates the generation of a desired image of the T1 time parameter for a cross-section or other desired sub-volume of an object (e.g. human body) under test or diagnosis.

The method and apparatus of this invention is believed to be particularly useful in processing NMR spin echo signals produced by successive 90° and 180° nutation r.f. pulses in the manner described by the earlier referenced related patents and/or patent applications. It is also believed to be particularly useful with the two-dimensional Fourier transform techniques described therein. However the general principles involved in this invention are believed to have possible application to the processing of NMR response signals elicited and/or processed by other techniques as well.

These as well as other objects and advantages of this invention will be more completely understood and appreciated by reading the following detailed description of the presently preferred exemplary embodiment of the invention taken in conjunction with the accompanying drawings, of which:

Figure 1:
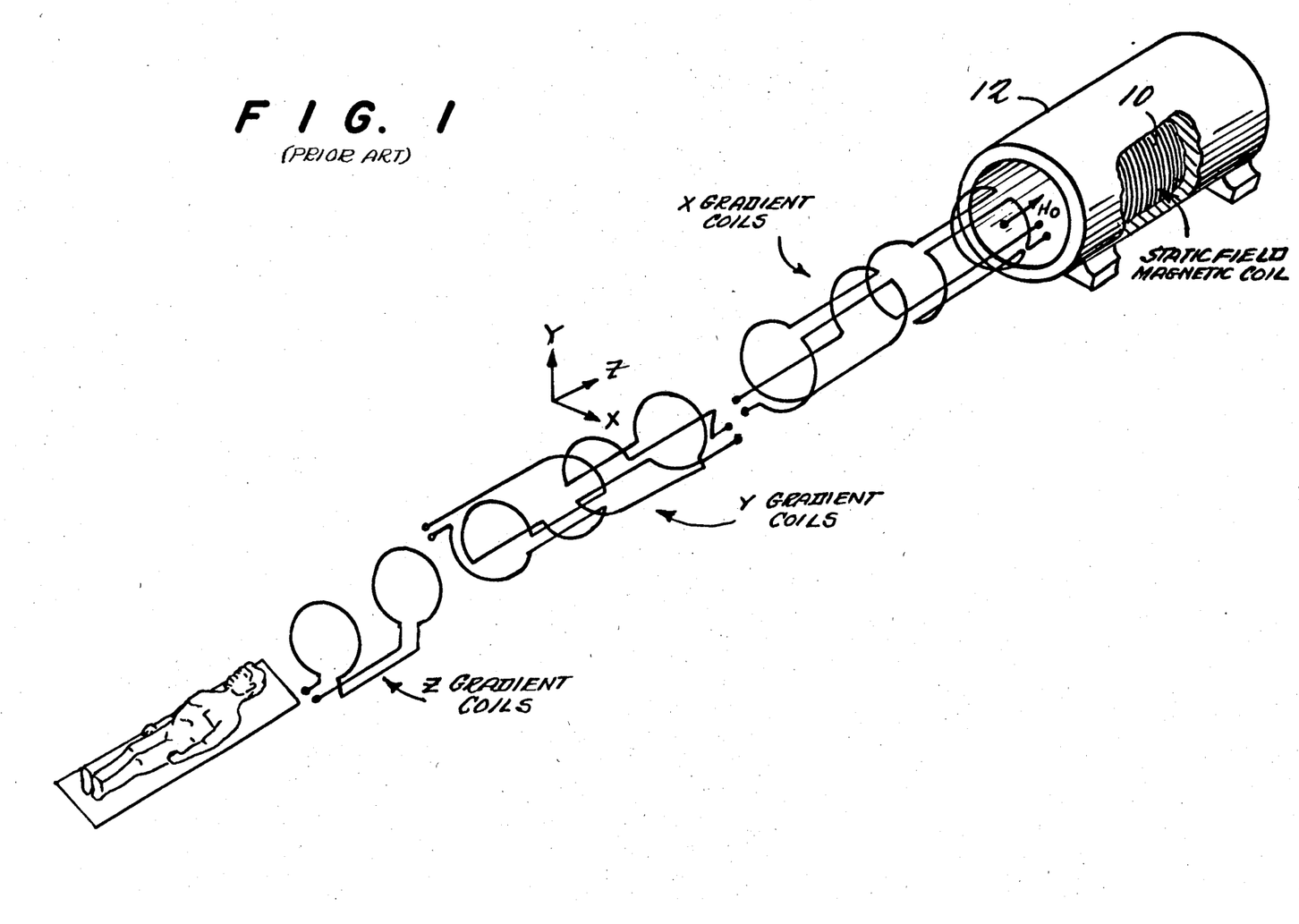
FIG. 1 is an exploded perspective view of a suitable static magnetic coil and gradient coils for use with an exemplary embodiment of this invention.
Figure 2:
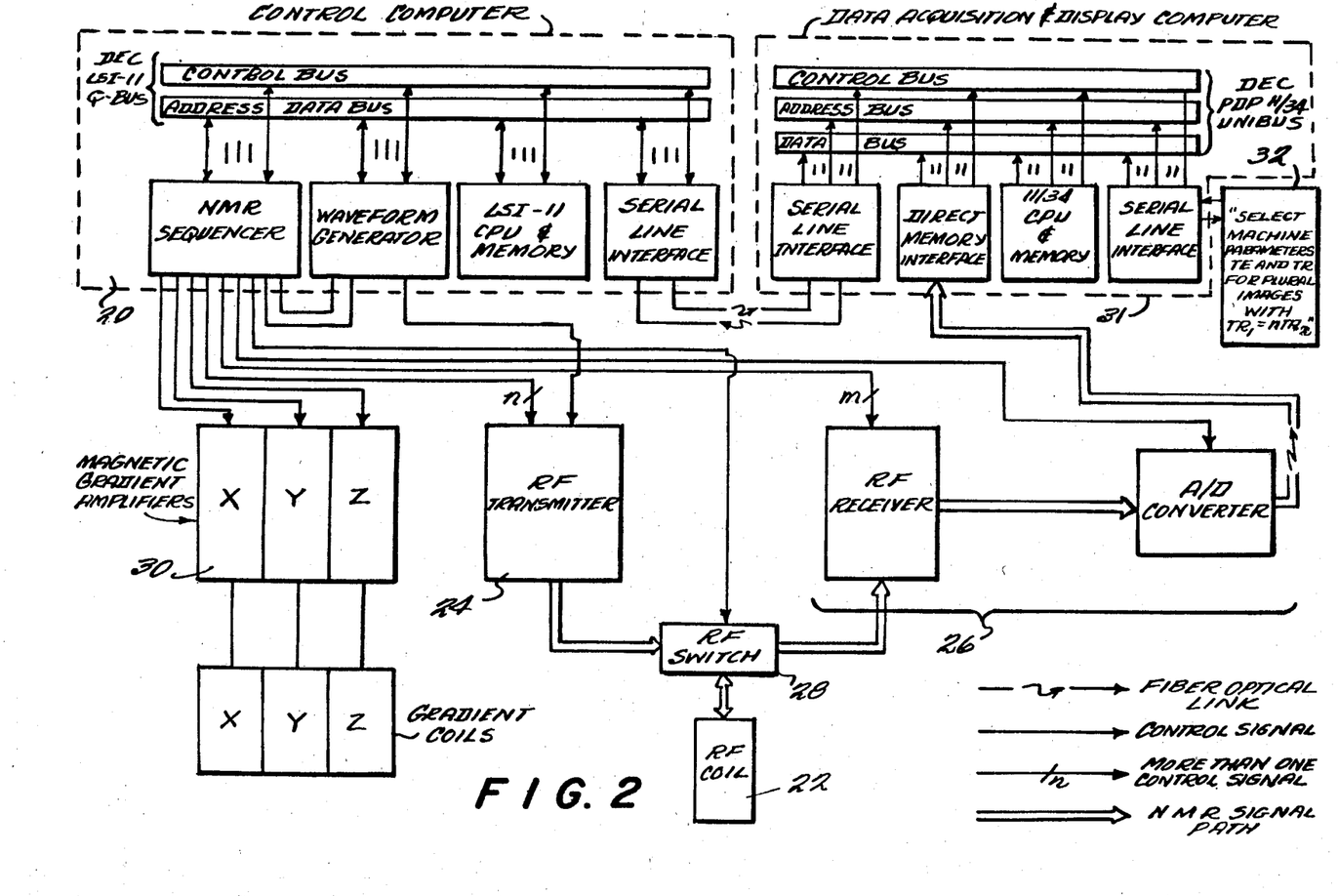
FIG. 2 is a block diagram of the computerized electronic apparatus utilized for driving the magnetic gradient coils and the r.f. circuits including a transmitting/receiving r.f. coil for an exemplary embodiment of this invention.

The hardwired apparatus employed in the presently preferred exemplary embodiment of this invention is substantially the same as that employed and disclosed in the above-referenced copending patent applications from which FIGS. 1-2 have been substantially copied (with the exception of box 32 in FIG. 2). The functional diffferences in this equipment and in its operation which permit one to practice the presently described and claimed invention are achieved by re-programming the way in which the TR machine parameters are related from one measurement cycle to the next (e.g. by integer multipliers) and in the manner in which the digital data signal processing computer(s) are programmed to reconstruct a desired array of T1 pixel value signals to be used in generating a visual image of the spatial distribution of nutated nuclear T1 densities throughout a given region of interest in an object under test.

Referring to FIG. 1, the present exemplary embodiment of this invention includes a static field magnetic coil 10 for generating a uniform static magnetic field $H_0$ directed along its axis. The coil 10 is, in the exemplary embodiment, preferably large enough to receive a human body and is preferably surrounded by a cryogenic housing 12 filled with liquid helium or the like so as to permit the coil 10 to be superconducting. In the exemplary embodiment, the static field is of approximately 3.5 KG thus making hydrogen nuclei exhibit NMR at approximately 15 MHz frequency. The X gradient coils, Y gradient coils and Z gradient coils shown in exploded perspective at FIG. 1 are actually concentrically superimposed within the static field magnetic coil 10 and are preferably constructed so as to receive at least a portion of the human body therein. The RF transmit/receive coil is also of conventional design and is designed so as to cause the RF magnetic field to be perpendicular to the static magnetic field $H_0$ as will be appreciated by those in the art.

Exemplary electronic apparatus for sequentially driving the various magnetic and RF coils is shown in simplified form at FIG. 2. Referring to FIG. 2, a computerized control system 20 is in communication with the data acquisition and display computer 31 via a serial line link. This control system constitutes the NMR system control which controls the amplitude, timing and/or phasing of the necessary transmitted RF pulses, current drives to the magnetic gradient coils and RF detection processes required for NMR. It includes conventional data storage, data output/input and data entry components as appropriate to the requirements of a particular installation. The computer control system 20 typically also comprises plural data processors operating in parallel under control of a host data acquisition and display processor 31 as will be understood from the earlier referenced copending applications. Except for the particular novel NMR measurement and reconstruction sequences and/or functions to be performed (e.g. as set forth in the illustrative flow diagrams of computer programs), the NMR system control 20 is of conventional design or as described in the earlier referenced copending applications and patents. If desired, an array processor (e.g., CSPI Co. Model MAP 200) may be incorporated in the digital signal processing circuits to speed the required reconstruction digital data signal processing.

The r.f. coil 22 is of conventional design and is used for both transmitting and receiving r.f. energy to/from the object under test. It is selectively communicated with by either the r.f. transmitter 24 or the r.f. receiver and A/D converter 26 via an r.f. switch 28 which is, in turn, controlled via a control line by the NMR system control 20. This portion of the apparatus is used for selectively transmitting nutation pulses of r.f. energy into the object under test (said pulses having programmable amplitude, frequency, phase and duration so as to effect a desired nuclei nutation) and for selectively detecting NMR r.f. spin echo responses from the object under test during programmable listening periods. The r.f. signal generator, the r.f. transmitter 24, r.f. receiver and A/D converter 26 and r.f. switch 28 may be of the type described in greater detail in the earlier referenced issued patents and/or copending applications.

The magnetic gradient coil drivers 30 are controlled by the NMR system control 20 to selectively drive the X gradient coil, Y gradient coil and Z gradient coil with currents of programmable magnitude, duration, polarity, etcetera.

Because spin echo signals from different measurement cycles are combined in the exemplary embodiment before Fourier transformation or other multi-dimensional reconstruction processes, improved system performance can be obtained under certain conditions (e.g. where there is a residual FID component of error in the spin echo) if the relative phase of the RF excitation signals (and of reference RF signals used for frequency translation and synchronous demodulation in the receiver circuitry) are accurately controlled and phased relative to the initiation of each r.f. pulse and/or r.f. detection window.

Conventional data entry devices are associaed with NMR control computer 20 in FIG. 2 to permit selection of a desired machine parameter value for the TR and/or TE parameters. TR and TE are the American College of Radiology standard symbols for the parameters which were formerly called a and b parameters in some of the earlier referenced related copending applications. TR is the repetition time of the measurement sequence and affects T1 contrast. TE is the time delay of the spin echo after the 90° nutation pulse and affects T2 contrast.

For example, as shown, a select machine parameter input 32 is provided. In the preferred exemplary embodiment, the selection means 32 for selecting the TR and TE machine parameters is the same keyboard used for other operator interfaces with the NMR system control 20. For example, the keyboard is typically incorporated as part of a conventional video display/keyboard input/output terminal device connected to one of the data processors of the NMR system control through the data acquisition and display computer 31 and associated serial line links as shown in FIG. 2. As will be appreciated, separate dedicated switches could also be provided if desired for this machine parameter selection function. In the exemplary embodiment, the TR and TE parameters are operator selected and are achieved by changing the delay times included in a programmed sequence of NMR r.f. nutation pulses and magnetic gradients.

In the exemplary embodiment of this invention, the data acquisition computer 31 may be programmed to permit selection of a desired $TR_1$ machine parameter for one measurement cycle used to generate spin echo intensity $I_1$ from a voxel of nuclei and then to automatically use $2TR_1$ (or some other integer multiple greater than one) for another measurement cycle used to generate spin echo intensity $I_2$ from that voxel of nuclei. Computer 31 is also preverably programmed to then directly and non-iteratively compute a T1 time value for such voxel of nuclei based on the $I_1$, $I_2$ and $TR_1$ parameter values.

Figure 3:
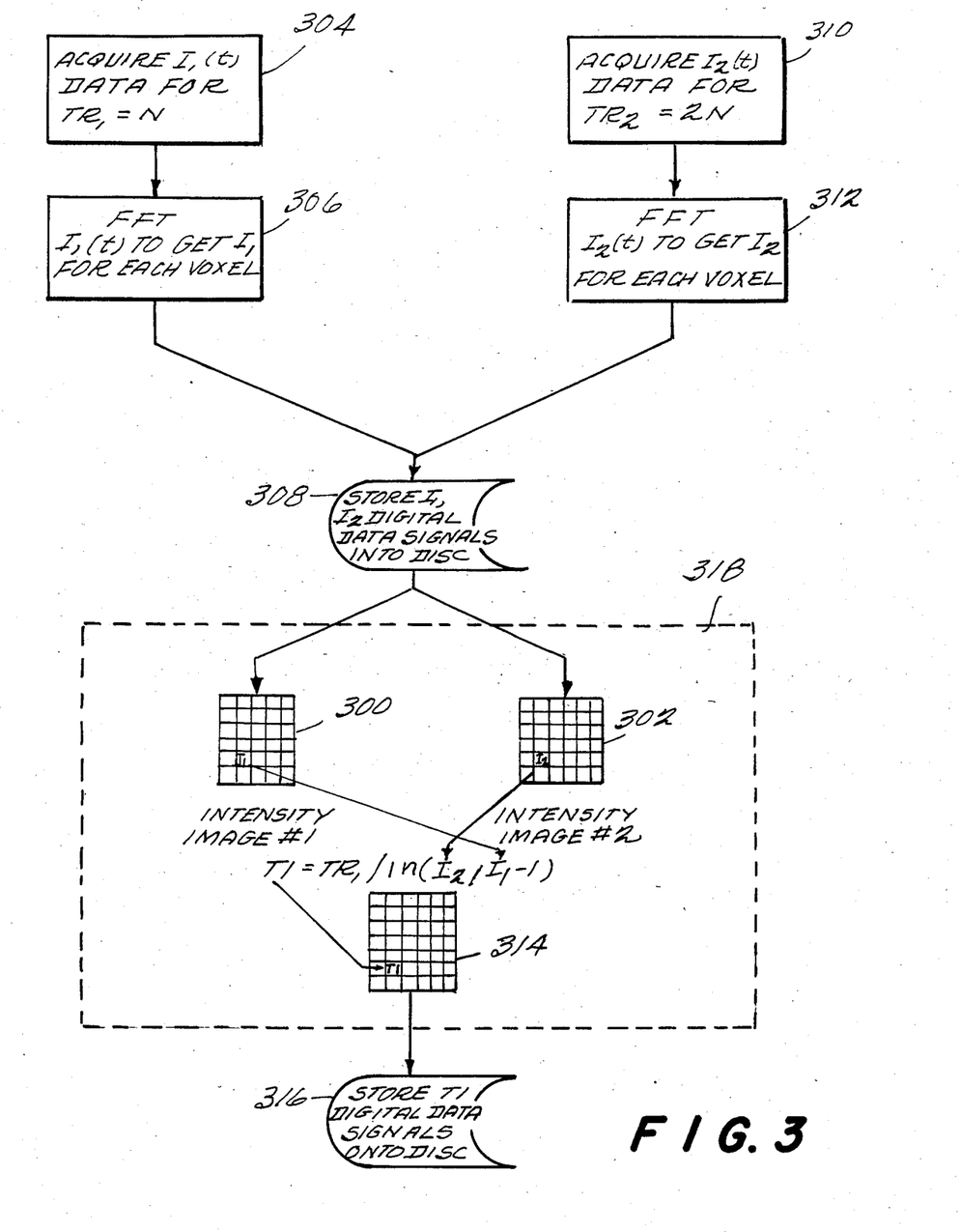
FIG. 3 is a functional flow diagram of one exemplary process in accordance with this invention for calculating T1 NMR images.

As schematically depicted at FIG. 3, "intensity" images 300 and 302 are acquired in conventional manners. For example, time varying spin echo signals are acquired at 304 (e.g. using successive 90° and 180° nutation pulses) at measurement cycle repetition intervals $TR_1$ having some desired value N. The raw measured spin echo data is then processed at 306 (e.g. by fast Fourier transformation in one or more dimensions) so as to obtain an intensity signal value $I_1$ for each "voxel" (volume element) of the slice or other selected sub-volume of the object under examination. The resulting intensity $I_1$ digital signal values may then be conventionally stored such as onto a magnetic disc at 308 and conventionally displayed in accordance with a raster pattern so as to produce a visual image of the point-by-point intensity distribution $I_1$ throughout the cross-section of interest as depicted at 300. Similarly, conventional techniques may be utilized as depicted at 310 and 312 so as to derive a second intensity image 302 using a different repetition interval $TR_2$. (As will be appreciated by those in the art, typically a different TE machine parameter would also be utilized in obtaining the second image so as to prevent derivation of a T2 image.) For reasons that will become more clearly apparent below, the $TR_2$ repetition interval has been chosen in the preferred exemplary embodiment of FIG. 3 to be twice the value $TR_1$.

As mentioned above, the T1 and T2 time relaxation parameters are believed to be useful in diagnosing disease and can certainly be used to differentiate between tissues. The T1 and T2 parameters have been derived heretofore based upon the following assumed relationship between the measured intensity I of an NMR response signal emanating from a given voxel:

$$I = H\,F(v)\,e^{-TE/T2}[1 - e^{-TR/T1}] \quad \text{(Equation 2)}$$

in which H is the hydrogen density in the voxel; F(v) is a complex function of flow (e.g. blood flow) within and through the voxel; TE is the spin echo-delay time of the spin echo acquisition measurement cycle; T2 is the average spin-spin relaxation parameter of the nutated nuclei in the voxel; TR is the repetition-time interval between signal acquisition measurement cycle; and T1 is the average spin-lattice relaxation parameter of the nutated nuclei in the voxel.

In order to generate a T1 or T2 signal value (e.g. an electrical or magnetic digital data signal generated or stored by a programmed digital data processor or computer) for each voxel (to create a T1 or T2 "image"), two (or more) intensity imaages $I_1$ and $I_2$ are acquired with differing values of TR (to get T1 images) or TE (for T2 images). (Sometimes there is a local averaging or "smoothing" performed on nearby voxels to reduce noise effects but this need not affect the process to be described.) With plural I images an iterative curve-fit method can be used to fing the desired T1 or T2 relaxation parameter. However, using only two images, the ratio of the intensity equations for the two images can be taken to solve for the desired relaxation parameter. The hydrogen density H and the flow-function F(v) are assumed not to vary for the two intensity images. Therefore the ratio-equations reduce, For T1, to:

$$\frac{I_1}{I_2} = \frac{H\,F(v)e^{-TE/T2}[1 - e^{-TR1/T1}]}{H\,F(v)e^{-TE/T2}[1 - e^{-TR2/T1}]} = \frac{1 - e^{-TR1/T1}}{1 - e^{-TR2/T1}} \quad \text{(Equation 3)}$$

(since TE is held constant for both these images) and, for T2, to:

$$\frac{I_1}{I_2} = \frac{H\,F(v)e^{-TE1/T2}[1 - e^{-TR/T1}]}{H\,F(v)e^{-TE2/T2}[1 - e^{-TR/T1}]} = \frac{e^{-TE1/T2}}{e^{-TE2/T1}} \quad \text{(Equation 4)}$$

(since TR is held constant for both these images.)

It is easy to solve the second equation for T2, that is, to isolate T2 on one side of the equation with an expression on the other side, involving only knowns, which can be evaluated directly and non-iteratively:

$$T2 = (TE_2 - TE_1)/\ln(I_1/I_2) \quad \text{(Equation 5)}$$

This is the typical method used to generate T2 images.

There is, however, no way to solve the first equation for T1 in general, That is, T1 cannot, in general, be isolated on one side of the equation with all the knowns on the other. Therefore, the only way to generate T1 images in the past has been by iterative methods—e.g. trying a "guess" value for T1 and successively correcting it based on the error in the results the assumption implies. And this had been so in the past even where the TR machine parameters have been for other reasons (or arbitrarily) already limited to integer multiple values with respect to one another. This iterative approach requires many complex operations to be performed in each step, for several steps, to get one T1 value (for a single voxel). It makes T1 calculation much slower than T2 calculation, so slow as to limit its usefulness as a practical clinical tool.

However, we have discovered that if the $TR_1$ and $TR_2$ parameters used to generate two I images $I_1$, $I_2$ are related by integer multipliers greater than one (i.e. $TR_2 = 2TR_1$; $TR_2 = 3TR_1$; etc.) then there is an analytic solution for T1. For example, if $TR_2 = 2TR_1$, then:

$$\frac{I_1}{I_2} = \frac{1 - e^{-TR1/T1}}{1 - e^{-TR2/T1}} \quad \text{(Equation 6)}$$

becomes $$\frac{I_1}{I_2} = \frac{1 - e^{-TR1/T1}}{1 - e^{-2TR1/T1}} \quad \text{(Equation 7)}$$

The denominator on the right can be factored:

$$\frac{I_1}{I_2} = \frac{1 - e^{-TR1/T1}}{(1 - e^{-TR1/T1})(1 + e^{-TR1/T1})} \quad \text{(Equation 8)}$$

which leads eventually to $$T1 = -TR_1/\ln(I_2/I_1 - 1) \quad \text{(Equation 9)}$$

This result has considerable advantages over the prior iterative approach. In one direct digital signal manipulation process, using known or measured parameter values, the T1 value for a voxel can be generated. It is now a process on the same order of speed, and using the same type of operations as the process used to generate a T2 signal value. Any digital computational "tricks" which speed up T2 calculations will probably also speed up T1 calculations in a like manner. In any event, T1 images can now be calculated rapidly enough to be used in clinical practice.

It will, of course, be recognized that there is no practical distinction between the case where $TR_2 nTR_1$ (n = any integer greater than one) and the case where $TR_2 = TR_1/n$—in effect, one is merely transposing the first and second measurement sequences. Accordingly, both cases are to be included herein whenever reference is here made to the fact that the first and second TR times $TR_1$ and $TR_2$ are related to one another by an integer multiplier greater than one.

The fact that integer multipliers of TR greater than two may also be successfully employed can be seen by taking up such cases (e.g. $TR_2 = 3TR_1$ and $TR_2 = 4TR_1$). With $TR_2 = 3TR_1$, the intensity-ratio equation is $$\frac{I_1}{I_2} = \frac{1 - e^{-TR1/T1}}{1 - e^{-3TR1/T1}} \quad \text{(Equation 10)}$$

The denominator on the right can still be factored:

$$\frac{I_1}{I_2} = \frac{1 - e^{-TR1/T1}}{(1 - e^{-TR1/T1})(1 + e^{-TR1/T1} + e^{-2TR1/T1})} \quad \text{(Equation 11)}$$

which can be rewritten $$e^{-2TR1/T1} + e^{-TR1/T1} + 1 = I_2/I_1 \quad \text{(Equation 12)}$$

substituting $x = e^{-TR_1/T1}$ (so $T1 = -TR_1/\ln(x)$), and moving $I_2/I_1$ to the left side:

$$x^2 + x + (1 - I_2/I_1) = 0 \quad \text{(Equation 13)}$$

Now the quadratic formula can be applied:

$$x = \frac{-1 \pm \sqrt{1 - 4(1 - I_2/I_1)}}{2} \quad \text{(Equation 14)}$$

$$= \tfrac{1}{2}(-1 + \sqrt{4I_2/I_1 - 3}) \quad \text{(Equation 15)}$$

(The negative answer can be disregarded).
Then, $$T1 = -TR_1/\ln(\tfrac{1}{2}(-1 + \sqrt{4I_2/I_1 - 3})) \quad \text{(Equation 16)}$$

This is still a big improvement over iteration techniques. The case of $TR_2 = 4TR_1$ uses the factorization $$\frac{I_1}{I_2} = \frac{1 - e^{-TR1/T1}}{(1 - e^{-TR1/T1})(e^{-3TR1/T1} + e^{-2TR1/T1} + e^{-TR1/T1} + 1)} \quad \text{(Equation 17)}$$

and is then solved using the cubic formula.
The solution is:

$$T1 = -TR_1/\ln((A-B-1)/3) \quad \text{(Equation 18)}$$

where $$A = \sqrt[3]{\sqrt{D} + 13.5I_2/I_1 - 10} \quad \text{(Equation 19)}$$

$$B = \sqrt[3]{\sqrt{D} - 13.5I_2/I_1 + 10} \quad \text{(Equation 20)}$$

$$D = \frac{182.25\, I_2^2}{I_1^2} - 270 I_2/I_1 + 108 \quad \text{(Equation 21)}$$

The 2 other solutions to the cubic equation are imaginary and are disregarded.

Accordingly, once the two intensity images 300 and 302 are conventionally obtained (as indicated at FIG. 3), then the corresponding T1 value for any given voxel (which in turn corresponds to a particular "pixel" (picture element) of the displayed image) may be directly non-iteratively generated to derive a T1 image as depicted at 314 in FIG. 3. The thus generated T1 digital data signals may be conventionally stored onto magnetic discs or the like as depicted at 316 for later use (e.g. to derive a CRT display).

Figure 4:
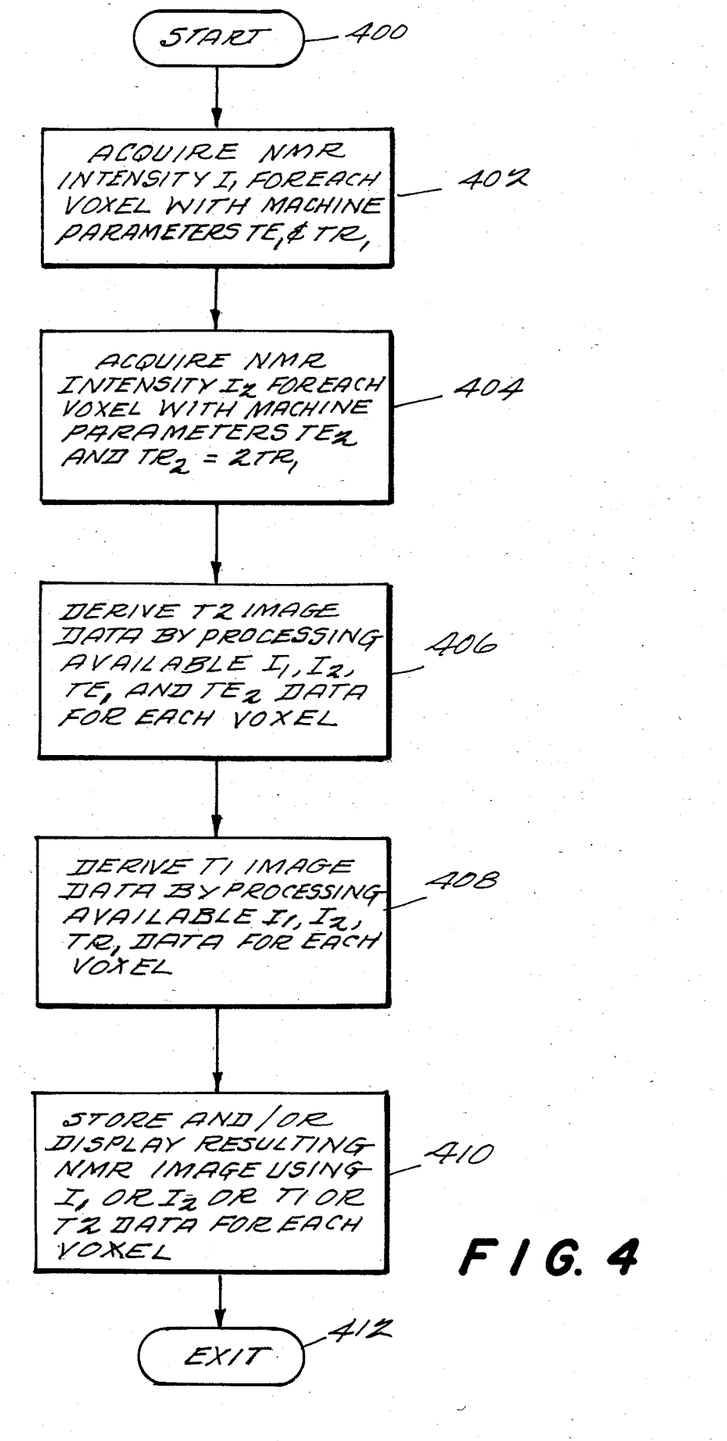
FIG. 4 is a flow diagram of a suitable exemplary computer program that may be utilized to condition the computer data processing apparatus of FIG. 2 to operate in accordance with this invention.

The digital data processing depicted in FIG. 3 including the novel generation of T1 spin-lattice relaxation time for a given voxel of nutated nuclei (as depicted within the dotted lines 318 of FIG. 3) is achieved by properly programming the digital data acquisition and display computer 31 shown in FIG. 2. Since most of the program control to be utilized by this system is conventional (and/or already explained in the earlier referenced related patents and/or patent applications), only an abbreviated flow chart of an illustrative exemplary computer program is depicted at FIG. 4. Entry to this program segment is conventionally made at 400 and intensity NMR images $I_1$ and $I_2$ are conventionally acquired as depicted at 402 and 404 respectively. A T2 image may also be conventionally generated as depicted at 406 using the available $I_1$, $I_2$, $TE_1$ and $TE_2$ data for each voxel. As will be noted in FIG. 4, in the present preferred exemplary embodiment, the machine parameter $TR_2$ used during step 404 is equal to twice the machine parameter $TR_1$ used in step 402.

Accordingly, the available digital data signals representing $I_1$, $I_2$ and $TR_1$ for each voxel may be processed at 408 in accordance with the above stated formulae to derive T1 digital data signal values for each voxel. As should be appreciated, once the process at 408 has been carried forth for each voxel (and therefore for each pixel to be displayed in the image) within the region of interest, the result will be digital data signal values defining a complete T1 image which T1 signal values then may be conventionally stored and/or displayed as depicted at step 410 in FIG. 4 to result in a T1 NMR image. Of course, step 410 may also involve the storage and/or display of T2, $I_1$ and/or $I_2$ image data as well. A conventional exit from the program segment is depicted at 412.

Although only a few exemplary embodiments of this invention have been described in detail above, those skilled in this art will appreciate that there are many possible modifications and variations that may be made in these embodiments while still retaining many of the novel advantages of this invention. Accordingly, all such modifications and variations are intended to be included within the scope of the appended claims.

What is claimed is:

1. A method of generating a spin-lattice relaxation time value T1 for NMR-excited nuclei, said method comprising the steps of:
   measuring an NMR signal intensity value $I_1$ for said nuclei using a first TR NMR time;
   measuring an NMR signal intensity value $I_2$ for said nuclei using a second TR NMR time where said first and second TR times are related to one another by an integer multiplier greater than one; and
   directly generating a spin-lattice relaxation time T1 for said nuclei from said measured $I_1$ and $I_2$ signal intensity values and said first TR time.

2. A method as in claim 1 wherein said second TR time is twice said first TR time and wherein said spin-lattice relaxation time T1 is generated in accordance with the function $T1 = TR/[\ln(I_2/I_1 - 1)]$.

3. A method as in claim 1 wherein said second TR time is three times said first TR time and wherein said spin-lattice relaxation time T1 is generated in accordance with the function $$(\tfrac{1}{2}(-1 + \sqrt{4I_2/I_1 - 3})).$$

4. A method as in claim 1 wherein said second TR time is four times said first TR time and wherein said spin-lattice relaxation time T1 is generated in accordance with the function $T1 = -TR_1/\ln(A-B-1)/3)$ where $$A = \sqrt[3]{\sqrt{D} + 13.5I_2/I_1 - 10} \; ;$$

$$B = \sqrt[3]{\sqrt{D} - 13.5I_2/I_1 + 10} \; ; \text{ and}$$

$$D = [(182.25 I_2^2)/I_1^2] - 270 I_2/I_1 + 108.$$

5. A method as in claim 1 wherein each of said measuring steps comprises:
   (a) exciting said nuclei with a 90° NMR nutation pulse;
   (b) subsequently exciting said nuclei with a 180° NMR nutation pulse;
   (c) subsequently detecting at least one NMR spin echo signal emanating from said nuclei; and
   (d) repeating steps (a)–(c) at a repetition interval related to the TR time for each said measuring step.

6. A method as in claim 5 wherein said second TR time is twice said first TR time and wherein said spin-lattice relaxation time T1 is generated in accordance with the function $T1=TR/[\ln(I_2/I_1-1)]$.

7. A method as in claim 5 wherein said second TR time is three times said first TR time and wherein said spin-lattice relaxation time T1 is generated in accordance with the function $$(\tfrac{1}{2}(-1 + \sqrt{4I_2/I_1 - 3}\;)).$$

8. A method as in claim 5 wherein said second TR time is four times said first TR time and wherein said spin-lattice relaxation time T1 is generated in accordance with the function $T1 = -TR_1/\ln((A-B-1)/3)$ where $$A = \sqrt[3]{\sqrt{D} + 13/5 I_2/I_1 - 10}\;;$$

$$B = \sqrt[3]{\sqrt{D} - 13.5 I_2/I_1 + 10}\;; \text{ and}$$

$$D = [(182.25 I_2{}^2)/I_1{}^2] - 270 I_2/I_1 + 108.$$

9. A method as in claim 1, 2, 3, 4, 5, 6, 7 or 8 wherein said generating step is performed in a digital computer by processing digital electrical signals representing said $I_1$, $I_2$ and TR values.

10. A method of generating an NMR image of the T1 spin-lattice relaxation times for NMR-excited nuclei within a selected region of an object, said method comprising the steps of:
   acquiring an NMR signal intensity value $I_1$ for each voxel within said selected region using first TE and first TR NMR timing signal values;
   acquiring an NMR signal intensity value $I_2$ for each voxel within said selected region using a second TR NMR timing signal value where said first and second TR timing signal values are related to one another by an integer multiplier greater than one; and
   directly and non-iteratively generating a spin-lattice relaxation time signal value $T_1$ for each voxel within said selected region from said $I_1$, $I_2$ and said first TR signal values.

11. A method as in claim 10 wherein said second $TR_2$ timing signal is two times said first TR timing signal value and wherein said spin-lattice relaxation time signal value T1 is generated in accordance with the function $T1=TR_1/[\ln(I_2/I_1-1)]$.

12. A method as in claim 10 wherein said acquired NMR signals are spin echos emanating from nuclei that have been successively nutated by 90° and 180°.

13. A method as in claim 12 wherein said second TR timing signal is two times said first TR timing signal value and wherein said spin-lattice relaxation time signal value $T_1$ is generated in accordance with the function $T1=TR/[\ln(I_2/I_1-1)]$.

14. A method as in claim 10, 11, 12 or 13 wherein said generating step is performed in a digital computer by processing digital electrical signals representing $I_1$, $I_2$ and $TR_1$ values.

15. Apparatus for generating a spin-lattice relaxation time value T1 for NMR-excited nuclei, said apparatus comprising:
   means for measuring an NMR signal intensity value $I_1$ for said nuclei using a first TR NMR time;
   means for measuring an NMR signal intensity value $I_2$ for said nuclei using a second TR NMR time where said first and second TR times are related to one another by an integer multiplier greater than one; and
   means for directly generating a spin-lattice relaxation time T1 for said nuclei from said measured $I_1$ and $I_2$ signal intensity values and said TR time.

16. Apparatus as in claim 15 including means for causing said second TR time to be twice said first TR time and wherein said means for generating includes means for generating said spin-lattice relaxation time T1 in accordance with the function $T1=TR/[\ln(I_2/I_1-1)]$.

17. Apparatus as in claim 15 wherein each of said means for measuring comprises:
   (a) means for exciting said nuclei with a 90° NMR nutation pulse;
   (b) means for subsequently exciting said nuclei with a 180° NMR nutation pulse;
   (c) means for subsequently detecting at least one NMR spin echo signal emanating from said nuclei; and
   (d) means for repetitively operating said means (a)–(c) at a repetition interval related to the TR time for each measurement.

18. Apparatus as in claim 17 including means for causing said second TR time to be twice said first TR time and wherein said means for generating includes means for generating said spin-lattice relaxation time T1 in accordance with the function $T1=TR/[\ln(I_2/I_1-1)]$.

19. Apparatus as in claim 15, 16, 17 or 18 wherein said means for generating comprises a digital computer for processing digital electrical signals representing said $I_1$, $I_2$ and TR values.

20. Apparatus for generating an NMR image of the T1 spin-lattice relaxation times for NMR-excited nuclei within a selected region of an object, said apparatus comprising:
   means for acquiring an NMR signal intensity value $I_1$ for each voxel within said selected region using first TE and first TR NMR timing signal values;
   means for acquiring an NMR signal intensity value $I_2$ for each voxel within said selected region using a second TR NMR timing signal value where said first and second TR timing signal values are related to one another by an integer multiplier greater than one; and
   means for directly and non-iteratively generating a spin-lattice relaxation time signal value T1 for each voxel within said selected region from said $I_1$, $I_2$ and said first TR signal values.

21. Apparatus as in claim 20 including means for causing said second $TR_2$ timing signal to be two times said first TR timing signal value and wherein said means for generating including means for generating said spin-lattice relaxation time signal value T1 in accordance with the function $T1 = TR_1/[\ln(I_2/I_1 - 1)]$.

22. Apparatus as in claim 20 wherein said means for acquiring includes means for acquiring spin echos emanating from nuclei that have been successively nutated by 90° and 180°.

23. Apparatus as in claim 22 including means for causing said second TR timing signal to be two times said first TR timing signal value and wherein said means for generating includes means for generating said spin-lattice relaxation time signal value T1 in accordance with the function $T1 = TR/[\ln(I_2/I_1 - 1)]$.

* * * * *